United States Patent
Jong

(10) Patent No.: US 8,026,981 B2
(45) Date of Patent: Sep. 27, 2011

(54) METHOD OF INTELLIGENTLY SELECTING A SIGNAL SOURCE AND ASSOCIATED APPARATUS

(75) Inventor: Her-Ming Jong, Hsinchu (TW)

(73) Assignee: MStar Semiconductor, Inc., ChuPei, Hsin-Chu Hsien (TW)

( * ) Notice: Subject to any disclaimer, the term of this patent is extended or adjusted under 35 U.S.C. 154(b) by 1306 days.

(21) Appl. No.: 11/617,739

(22) Filed: Dec. 29, 2006

(65) Prior Publication Data
US 2007/0153132 A1    Jul. 5, 2007

Related U.S. Application Data

(60) Provisional application No. 60/766,237, filed on Jan. 3, 2006.

(51) Int. Cl.
 *H04N 5/268* (2006.01)
 *H04N 5/46* (2006.01)

(52) U.S. Cl. ........ 348/705; 348/706; 348/552; 348/553; 348/739; 710/8; 710/12

(58) Field of Classification Search .................. 348/705, 348/706, 552, 553, 555, 572, 739; 710/8, 710/12, 46, 100
See application file for complete search history.

(56) References Cited

U.S. PATENT DOCUMENTS

| | | | |
|---|---|---|---|
| 2002/0113892 A1 | 8/2002 | Sakai | |
| 2005/0078935 A1 | 4/2005 | Sun | |
| 2005/0134746 A1* | 6/2005 | Brandt | 348/705 |

FOREIGN PATENT DOCUMENTS

| | | |
|---|---|---|
| CN | 1132976 A | 10/1996 |
| CN | 1300945 A | 6/2001 |
| CN | 2433677 Y | 6/2001 |
| CN | 1327676 A | 12/2001 |
| CN | 1508983 A | 6/2004 |
| CN | 1525751 A | 9/2004 |
| CN | 1571486 A | 1/2005 |
| CN | 1574924 A | 2/2005 |
| CN | 1642248 A | 7/2005 |
| CN | 1767611 A | 5/2006 |
| CN | 1845580 A | 10/2006 |
| CN | 1856072 A | 11/2006 |
| JP | 2005150897 | 6/2005 |
| TW | 398716 | 7/2000 |
| TW | 534565 | 5/2003 |
| TW | I231150 | 4/2005 |

* cited by examiner

*Primary Examiner* — Michael Lee
*Assistant Examiner* — Jean W Desir
(74) *Attorney, Agent, or Firm* — Winston Hsu; Scott Margo

(57) ABSTRACT

A method of intelligently selecting a signal source and associated apparatus is provided. The method comprises the following steps. A display is activated. The display detects activities of a plurality of connection ports to determine at least one active video source. The display displays an image according to the at least one active video source and/or a priority. The connection ports can be an HDMI port, a DVI port, an A/V port or a Y/Pb/Pr port.

9 Claims, 13 Drawing Sheets

METHOD OF INTELLIGENTLY SELECTING A SIGNAL SOURCE AND ASSOCIATED APPARATUS

CROSS REFERENCE TO RELATED APPLICATIONS

This application claims the benefit of U.S. Provisional Application No. 60/766,237, filed Jan. 3, 2006, and included herein by reference.

BACKGROUND OF THE INVENTION

1. Field of the Invention

The present invention relates to a method of intelligently selecting a signal source and an associated apparatus, and more particularly, to a method of intelligently selecting a signal source by intelligently auto-configuring AV inputs and associated apparatus.

2. Description of the Prior Art

With speedy advancements in multimedia technology, miscellaneous audio-video apparatuses are used for providing data transmission and sense enjoyment of images and voices. However, as the audio-video technology changes with each passing day, image signals and voice signals with various signal standards come with the tide of fashion. Digital televisions usually support various I/O interfaces, for example, video signals include a composite video broadcast signal (CVBS), an S video signal, a component video signal (Y, Pb, or Pr), etc.

In the market nowadays, three kinds of analog video signals can be found by consumers, which are the composite video broadcast signal, the S video signal, and the component video signal. The composite video broadcast signal transmits its luminance signal mixed up with its chrominance signal together to be compatible to both gray-scale and color television systems in order to save bandwidths.

The S terminal transmits the luminance signal (Y) and the chrominance signal (C) separately. Please note that the component video signals in different television system use different symbol representatives. For example, the chrominance signals of an NTSC system are expressed by I signal and Q signal, and the chrominance signals of PAL system are expressed by U signal and V signal. The component video signals include Y, Cb, and Cr (or Y, Pb, and Pr), where Y represents the luminance signal and Cb and Cr represent the chrominance signal.

Therefore, most multimedia devices and monitors will support the A/V terminals, the S terminal, and the component video signal terminals to satisfy the user's demands. An audio-video connection port may include three A/V terminals and three chrominance terminals. Some monitors are equipped with several audio-video connection ports and connect to several video players. Hence, many connectors having the same appearance are installed adjacently. Wrong connection happens often, especially when the RCA connectors of the multimedia devices, such as televisions, are not easily accessible by the user due to facing to a wall. So, apparatuses cannot operate or display normally.

On the other hand, most of multimedia devices, such as flat panel displays, are equipped with a plurality of connection ports for connecting composite video terminals, S terminals and component video signal terminals. A flat panel display becomes a recreation center of modern life, for watching broadcasting TV programs, cable programs, pay programs, watching DVDs, and playing game machines, including PS3, Wii and XBOX etc. Each video source, along with accompanying audio source, requires a connection port of the display. For different video purposes, whenever the display is turned on, the user needs to select a correct video source to normally display. Therefore, selecting a video source for a multimedia device bothers the user seriously, especially accompanying wrong connection problems described above.

SUMMARY OF THE INVENTION

It is therefore an objective of the present invention to provide a method of intelligently selecting signal sources and associated apparatus to solve the above-mentioned problems.

The present invention discloses a display capable of intelligently selecting signal sources according to an embodiment of the present invention. The display comprises a plurality of AV connection ports for receiving signals, and a control chip coupled to the connection ports for processing the signals. The control chip detects the activity of AV connection ports to determine at least one active source among the signal sources. The control chip controls the display to show two images with the highest two priorities in PIP.

The present invention also discloses a method of intelligently selecting signal sources according to an embodiment of the present invention. At first, a display is powered on and initialized. A connection relationship of a plurality of connection ports is auto-configured. Determine at least one active source(s) by detecting activities of the connection ports. According to a priority and the at least one active source(s) the display displays an image. Alternatively, the display shows two images with the highest two priorities in PIP. Thus, the user switches active sources according to the priority and the active sources, without bothering by inactive sources.

The present invention also discloses a method of intelligently selecting signal sources according to an embodiment of the present invention. Periodically detect activities of a plurality of connection ports. Determine whether a new active source is present. Activate a subscreen on the display to display an image on the subscreen in response to the new active source and/or a priority.

These and other objectives of the present invention will no doubt become obvious to those of ordinary skill in the art after reading the following detailed description of the preferred embodiment that is illustrated in the drawings.

DETAILED DESCRIPTION

Figure 1:
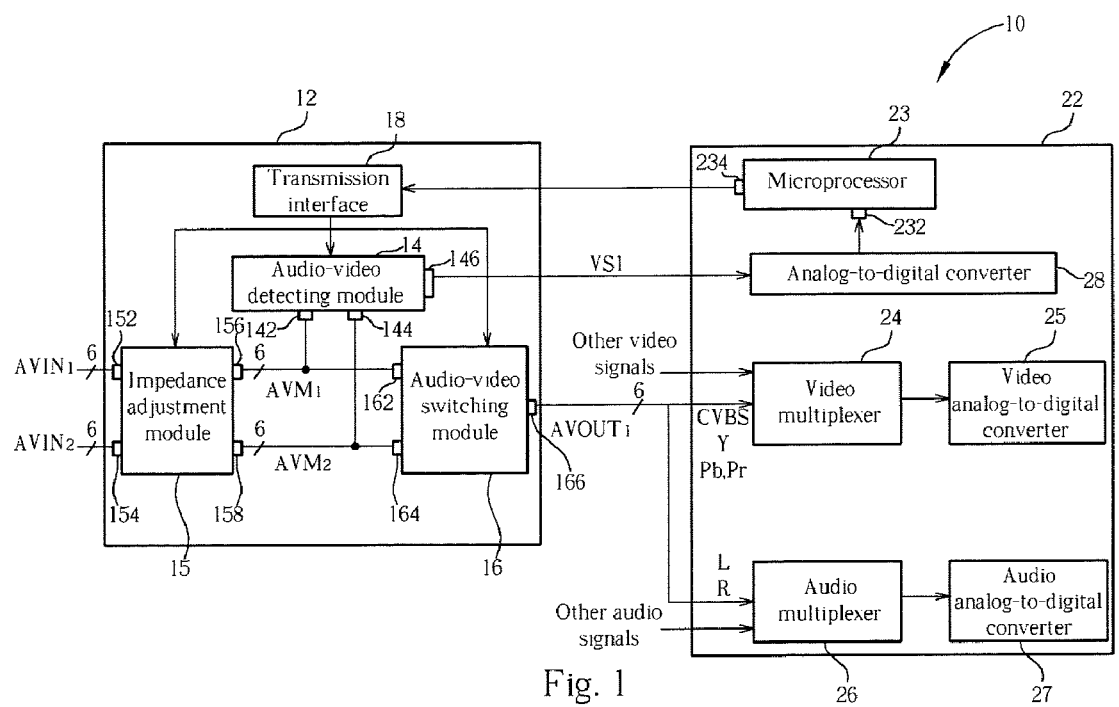
FIG. 1 shows a multimedia device capable of auto-configuring AV input signals according to an embodiment of the present invention.

FIG. 1 shows a multimedia device 10 capable of auto-configuring AV input signals according to an embodiment of the present invention. The multimedia device 10 includes an audio-video switching device 12 and an audio-video processing device 22. The audio-video switching device 12 includes an audio-video detecting module 14, an impedance adjustment module 15, an audio-video switching module 16, and a transmission interface 18. The audio-video processing device 22 includes a microprocessor 23, an analog-to-digital converter (ADC) 28, a video multiplexer 24, a video ADC 25, an audio multiplexer 26, and an audio ADC 27. The audio-video detecting module 14 receives and detects at least one set of AV input signals. For example, the audio-video detecting module 14 includes a first set of input ends 142, a second set of input ends 144, and an output end 146. The first set of input ends 142 receives a first set of AV adjusted signals $AVM_1$, the second set of input ends 144 receives a second set of AV adjusted signals $AVM_2$, the audio-video detecting module 14 outputs a voltage signal VS1 at the output end 146 and transmits the voltage signal VS1 to the ADC 28, and the ADC 28 measures a voltage value of the voltage signal VS1. According to the measured voltage value, a type for the AV adjusted signal can be determined. The microprocessor 23 coupled to the ADC 28 via an input end 232 receives the voltage value measured by the ADC 28. An output end 234 of the microprocessor 23 is coupled to the transmission interface 18, and the microprocessor controls operations of the audio-video detecting module 14, the impedance adjustment module 15, and the audio-video switching module 16 via the transmission interface 18 according to the result measured by the ADC 28. For example, the transmission interface 18 is an I²C interface. The impedance adjustment module 15 includes a first set of input ends 152, a second set of input ends 154, a first set of output ends 156, and a second set of output ends 158. The first set of input ends 152 of the impedance adjustment module 15 receives a first set of AV input signals $AVIN_1$, and the second set of input ends 154 receives a second set of AV input signals $AVIN_2$. For example, the first set of AV input signals $AVIN_1$, includes six AV input signals having $Y_1$, $Pb_1$, $Pr_1$, $CVBS_1$, $R_1$, and $L_1$, and the second set of AV input signals $AVIN_2$ includes six AV input signals having $Y_2$, $Pb_2$, $Pr_2$, $CVBS_2$, $R_2$, and $L_2$. The impedance adjustment module 15 is controlled by the microprocessor 23 according to the result measured by the ADC 28. The first set of AV adjusted signals $AVM_1$, including $Y_{11}$, $Pb_{11}$, $Pr_{11}$, $CVBS_{11}$, $R_{11}$, and $L_{11}$, is outputted at the first set of output ends 156 of the impedance adjustment module 15, and the second set of AV adjusted signals $AVM_2$, including $Y_{22}$, $Pb_{22}$, $Pr_{22}$, $CVBS_{22}$, $R_{22}$, and $L_{22}$, is outputted at the second set of output ends 158 of the impedance adjustment module 15 after the impedance adjustment module 15 adjusts impedance. The audio-video switching module 16 is coupled to the impedance adjustment module 15 via the first set of input ends 162 and the second set of input ends 164, which receive the first set of AV adjusted signals $AVM_1$ and the second set of AV adjusted signals $AVM_2$, respectively. The audio-video switching module 16 is controlled by the microprocessor 23 according to the result measured by the ADC 28. One set of signals is selected from the first set of AV adjusted signals AVM, and the second set of AV adjusted signals $AVM_2$, such as an AV source selected by users, to generate a set of AV output signals $AVOUT_1$ having a correct AV sequence and a matching impedance. The set of AV output signals $AVOUT_1$ outputted at the set of output ends 166 includes six AV output signals Y, Pb, Pr, CVBS, R, and L. In this embodiment, the users can select the AV input signals $AVIN_1$ or $AVIN_2$ to output the set of AV output signals $AVOUT_1$ having the correct AV sequence and the matching impedance through the audio-video switching device 12 if the users inverse AV terminal connections.

The audio-video switching device 12 cooperates with the microprocessor 23 and the ADC 28 of the audio-video processing device 22, which shows an example can share hardware resources, such as the microprocessor 23 and the ADC 28. Those skilled in the art can understand the spirit that the microprocessor 23 and the ADC 28 can be implemented into the audio-video detecting module 14 of the audio-video switching device 12.

Please refer to FIG. 1. The video multiplexer 24 is coupled between the audio-video switching module 16 and the video ADC 25 for receiving the AV output signals $AVOUT_1$ of the audio-video switching module 16 and other video input signals, such as the video signals separated from an S terminal. The video ADC 25 is coupled to the video multiplexer 24 for receiving and digitizing the video output signals outputted from the video multiplexer 24. The audio multiplexer 26 is coupled between the audio-video switching module 16 and the audio ADC 27 for receiving the AV output signals $AVOUT_1$ of the audio-video switching module 16 and other audio input signals, such as the audio signals separated from a coaxial cable of a television antenna, to selectively output AV output signals R and L. The audio ADC 27 is coupled to the audio multiplexer 26 for receiving and digitizing the audio output signals outputted from the audio multiplexer 26. The ADC 27 can be implemented in a flat display. On the other hand, the video multiplexer 24 and the audio multiplexer 26 are optional circuits that can provide a flexibility of selecting other signal sources, such as a TV signal source.

In this embodiment, the audio-video switching device 12 receives the AV input signals $AVIN_1$, including $Y_1$, $Pb_2$, $Pr_1$, $CVBS_1$, $R_1$, and $L_1$, and $AVIN_2$, including $Y_2$, $Pb_2$, $Pr_2$, $CVBS_2$, $R_2$, and $L_2$. Alternatively, it can be designed to receive more sets of AV input signals or just one set of AV input signals. The audio-video detecting module 14 detects a type of each AV input signal according to the result measured by the ADC 28. For example, the AV input signals $Y_1$, $Pb_1$, $Pr_1$, $CVBS_1$, $Y_2$, $Pb_2$, $Pr_2$, and $CVBS_2$ are of video types, and the AV input signals $R_1$, $L_1$, $R_2$, and $L_2$ are of audio types. The impedance adjustment module 15 adjusts the matching impedance of each AV input signal according to the result measured by the ADC 28 individually, for example, an input impedance of the AV input signals $Y_1$, $Pb_1$, $Pr_1$, $CVBS_1$, $Y_2$, $Pb_2$, $Pr_2$, and $CVBS_2$ is preferably 75 Ω(ohm), and an input impedance of the AV input signals $R_1$, $L_1$, $R_2$, and $L_2$ is preferably 500-5 kΩ(kilo-ohm). The AV adjusted signals $AVM_1$ and $AVM_2$ are produced after the impedance adjustment module 15 adjusts the matching impedance. Preferably, the audio-video switching module 16 chooses one set from the sets of AV adjusted signals to generate the set of AV output signals $AVOUT_1$, including the six AV output signals Y, Pb, Pr, CVBS, R, and L. For instance, the audio-video switching device 12 detects and switches to a signal source that actually transmits signals if the AV source selected by the users does contain no signal therein. Alternatively, hardware of the impedance adjustment module 15 and audio-video switching module 16 can be exchanged. The audio-video switching module 16 may be designed to be capable of selecting two sets of AV output signals with the correct AV sequence and the matching impedance to be transmitted to two sets of audio ADCs and video ADCs (not shown in FIG. 1) for further processing, for PIP (picture-in-picture) display.

Figure 2:
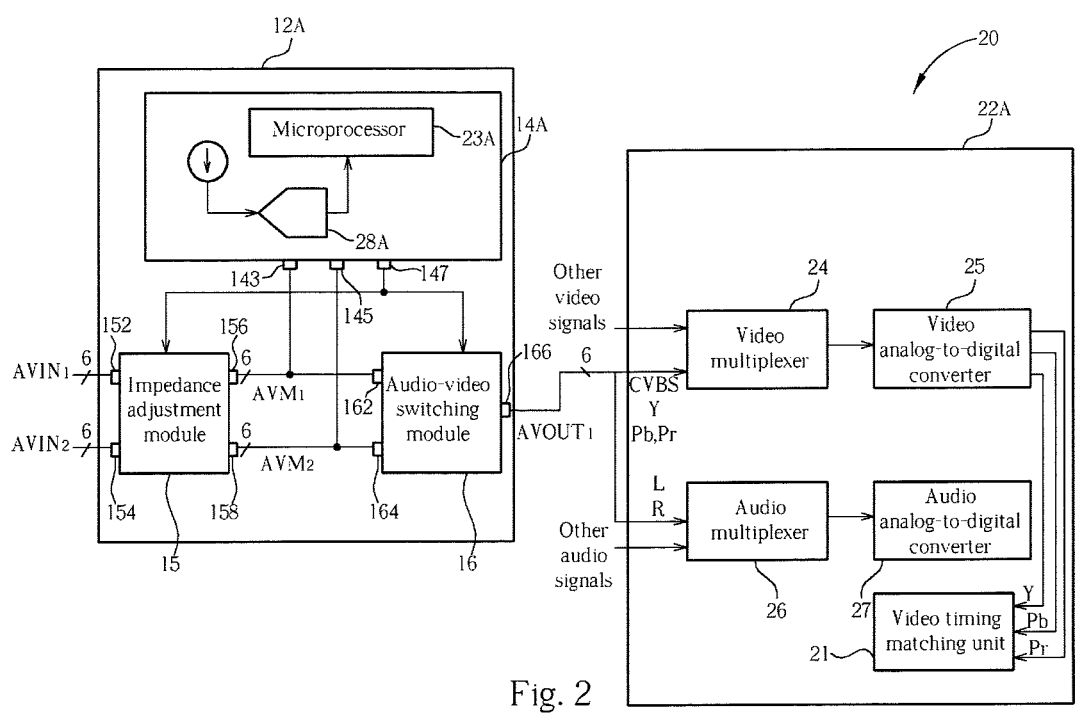
FIG. 2 shows a multimedia device capable of auto-configuring AV input signals according to another embodiment of the present invention.

FIG. 2 shows a multimedia device 20 capable of auto-configuring AV input signals according to another embodiment of the present invention. The multimedia device 20 includes an audio-video switching device 12A and an audio-video processing device 22A. In this embodiment, a microprocessor 23A and an ADC 28A are implemented in an audio-video detecting module 14A for detecting AV signals and outputting an AV detecting result. The impedance adjustment module 15 adjusts impedance according to the AV detecting result, and the audio-video switching device 12A switches and arranges the sequence of the AV signals appropriately according to the AV detecting result. The audio-video processing device 22A includes the video multiplexer 24, the video ADC 25, the audio multiplexer 26, the audio ADC 27, and a video timing matching unit 21. The video timing matching unit 21 is coupled to the video ADC 25 for receiving the AV output signals Y, Pb, and Pr after digitization. For example, the video timing matching unit 21 determines whether the AV output signals Pb and Pr outputted by the video ADC 25 are signals correlated with the AV output signal Y to decide whether they belong to the same AV source.

Figure 3:
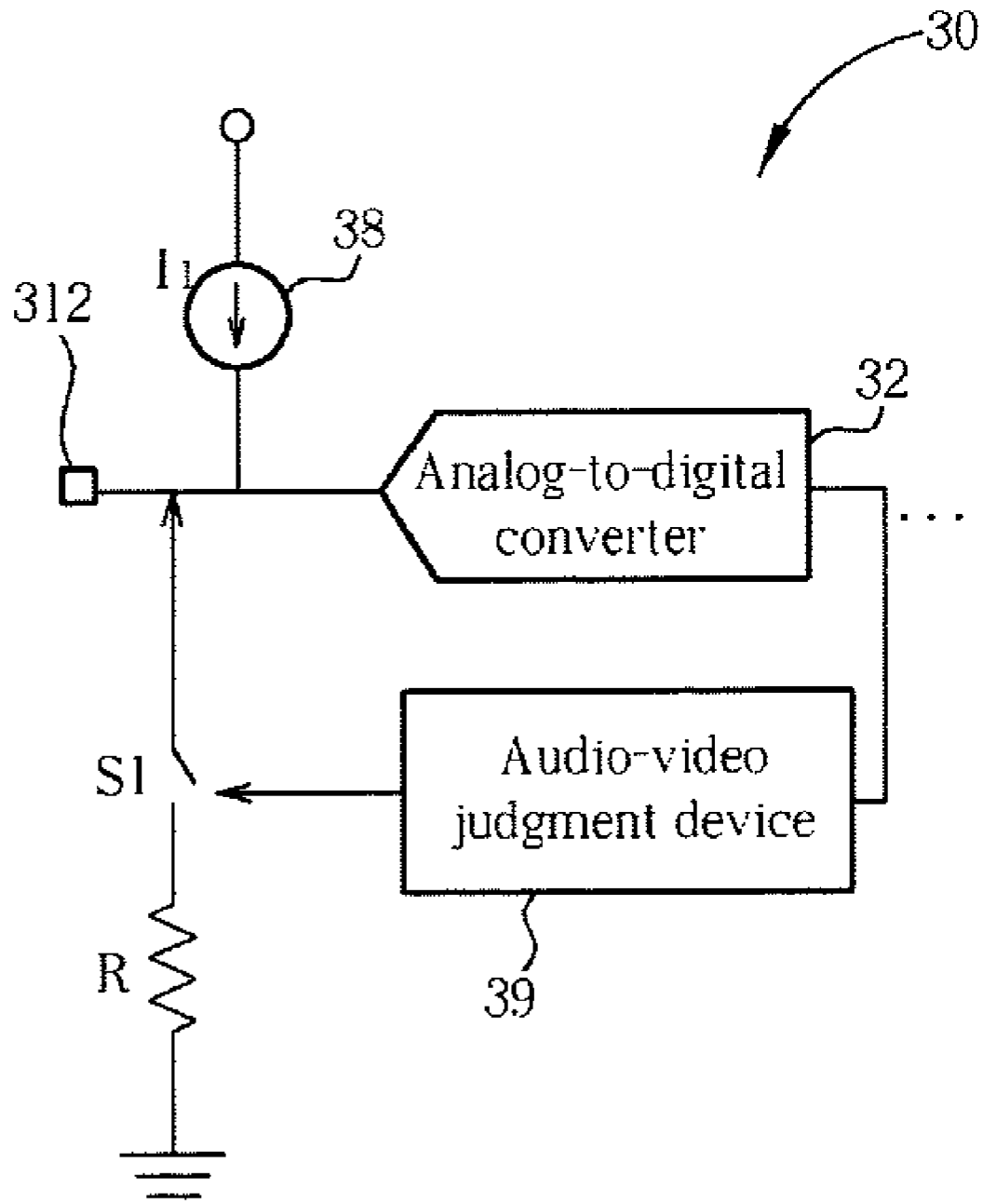
FIG. 3 shows an audio-video detector capable of auto-configuring AV input signals according to an embodiment of the present invention.

FIG. 3 shows an audio-video detector 30 capable of auto-detecting AV input signals according to an embodiment of the present invention. The audio-video detector 30 receives the AV input signals via an input end 312. A current source 38 provides a current $I_1$ to the input end 312. An ADC 32 is coupled to the input end 312 and to the current source 38 for measuring a voltage value at the input end 312. An audio-video judgment device 39 is coupled to the ADC 32 for determining a type of each received AV input signal according to the measurement by the ADC 32, so as to determine non-connected (NC), an audio signal, or a video signal. The AV input signals could be one set of the AV input signals in FIG. 1, including Y, Pb, Pr, CVBS, R, and L. Each input pin of the AV input signals is fed by the current source 38 individually or sequentially. Depending on different impedance characteristics and different response, the audio signal or the video signal are determined. A switch S1 is turned on to provide a matching resistor R when the AV input signal is determined to be the audio signal or the video signal by the audio-video judgment device 39. For example, the matching resistor for the video signal is 75 Ω. Circuits of the audio-video detector 30 capable of auto-detecting AV signals can be implemented for AV detecting operations of the audio-video detecting module 14, the impedance adjustment module 15, the transmission interface 18, the microprocessor 23, and the ADC 28 in FIG. 1. The current source 38, the ADC 32, and the audio-video judgment device 39 of the audio-video detector 30 shows an example for detecting AV input signals of the AV detecting module 24A in FIG. 2.

Figure 4:
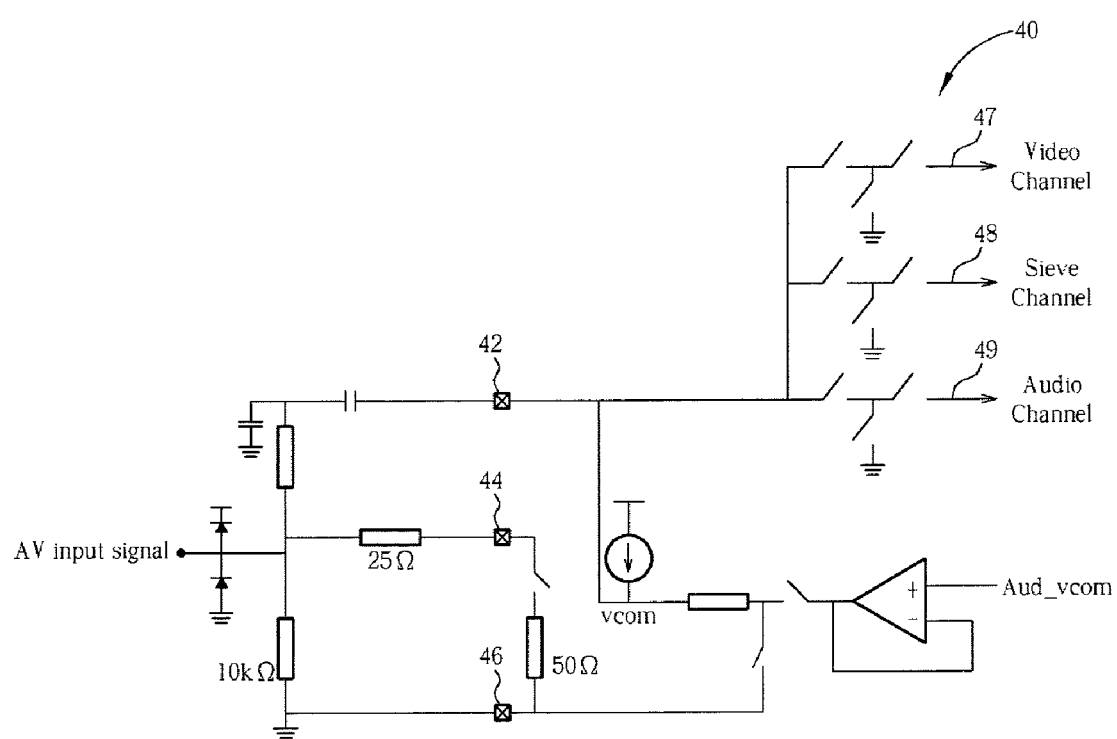
FIG. 4 shows an audio-video detector capable of auto-configuring AV input signals according to another embodiment of the present invention.

FIG. 4 shows an audio-video detector 40 capable of auto-configuring AV input signals according to another embodiment of the present invention. For example, when implemented in a display controller (not shown in FIG. 4), the audio-video detector 40 receives the AV input signals through three pads 42, 44, and 46 and transmits the AV input signals to an ADC and a microprocessor (not shown in FIG. 4) inherently residing in the display controller (not shown in FIG. 4) through a sieve channel 48. After an AV input signal is determined as an audio signal, a video signal, or non-connected, switches are utilized to provide a proper matching impedance and the signal path is directed to a video channel 47 or an audio channel 49 accordingly for further processing by associated ADC and processing circuits (not shown in FIG. 4).

Figure 5:
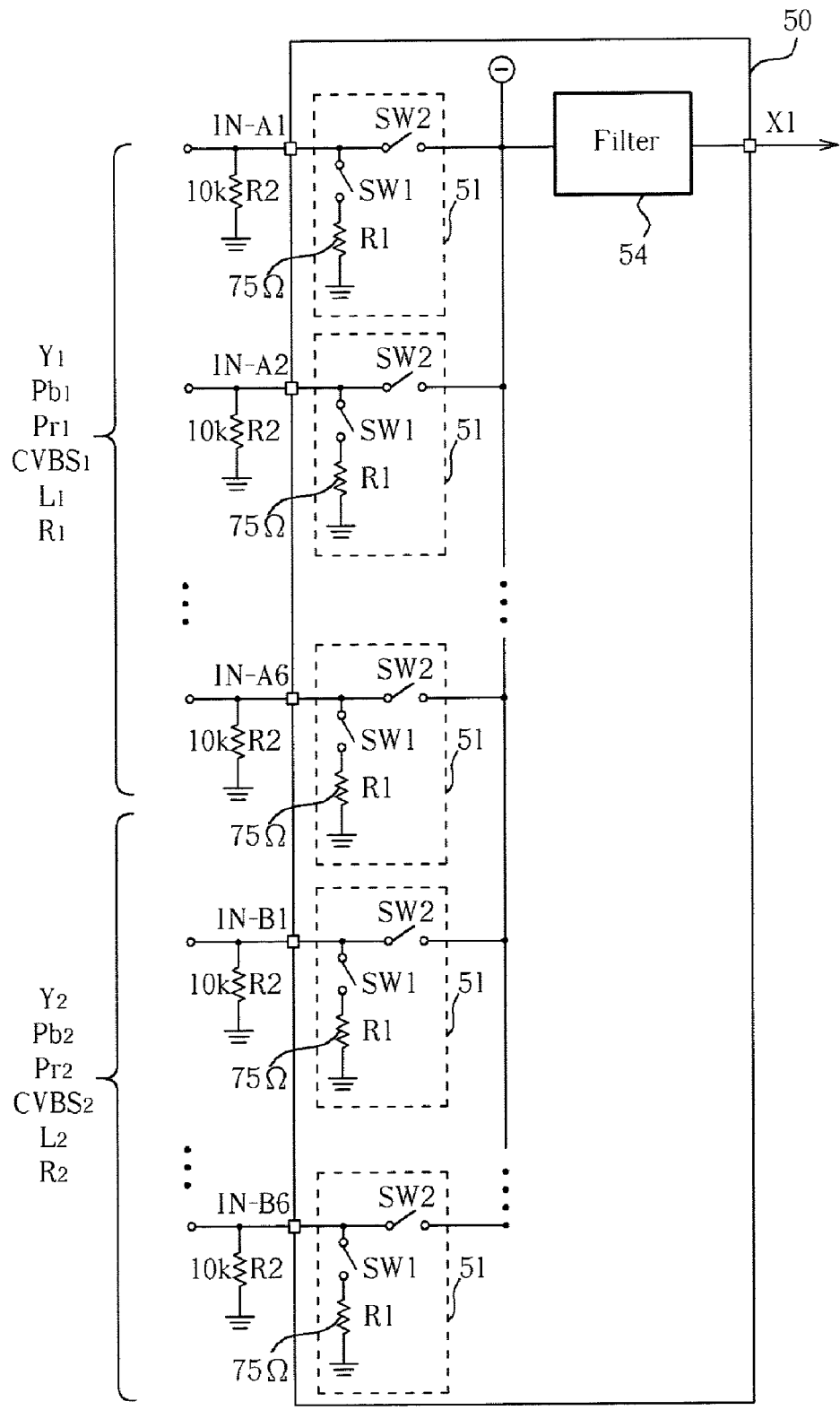
FIG. 5 shows an impedance adjustment module according to an embodiment of the present invention.

FIG. 5 shows an impedance adjustment module 50 according to an embodiment of the present invention. The impedance adjustment module 50 includes a plurality of impedance adjustment units 51, with input ends IN-A1~IN-A6 and IN-B1~IN-B6 for receiving AV input signals respectively, such as the six AV input signals $Y_1$, $Pb_1$, $Pr_1$, $CVBS_1$, $R_1$, and $L_1$ of the AV input signals $AVIN_1$ and the six AV input signals $Y_2$, $Pb_2$, $Pr_2$, $CVBS_2$, $R_2$, and $L_2$ of the AV input signals $AVIN_2$. In this embodiment, the impedance adjustment module 50 includes twelve impedance adjustment units 51. Each input end of each impedance adjustment unit 51 is externally coupled to a second resistor R2 as a predetermined impedance at the input end, e.g. the second resistor R2 is 10KΩ. A second switch SW2 is coupled to the input end and to the second resistor R2, and a first switch SW1 is coupled between the input end and an input resistor R1. The impedance of each AV input signal can be adjusted by switches SW1 and SW2. The input resistor R1 is preferably 75 Ω.

For example, the voltage value of an output end X1 of the impedance adjustment module 50 is measured when the second switch SW2 of the first impedance adjustment unit 51 (the upper one) is turned on and all the other second switches SW2 and all the first switches SW1 are turned off. The input impedance of the AV input signal received by the input end IN-A1 of the first impedance adjustment unit 51 can be estimated through an ADC, such as a SARADC (successive approximation register ADC), inherently installed in the display controller. The type of each AV input signal is determined according to the voltage value of the output end X1 according to different input impedances under conditions of non-connected, connecting to the audio signal, and connecting to the video signal. In this embodiment, the input impedance of the AV input signal is 10KΩ, 500 Ω-5KΩ, and 75 Ω under the conditions of being non-connected, connecting to the audio signal, and connecting to the video signal, respectively. The first switch SW1 is turned off when non-connected condition or connecting to the audio signal is detected. The first switch SW1 is turned on to provide the resistor R1 of 75 Ω when connecting to the video signal is detected. R1 couples to the second resistor R2 of 10KΩ in parallel, so the overall resistance is approximate to the first resistor R1 since R2 is much greater than R1. The impedance adjustment module 50 further includes a filter 54 coupled between each impedance adjustment unit 51 and the output end X1 for filtering noise interference.

Figure 6:
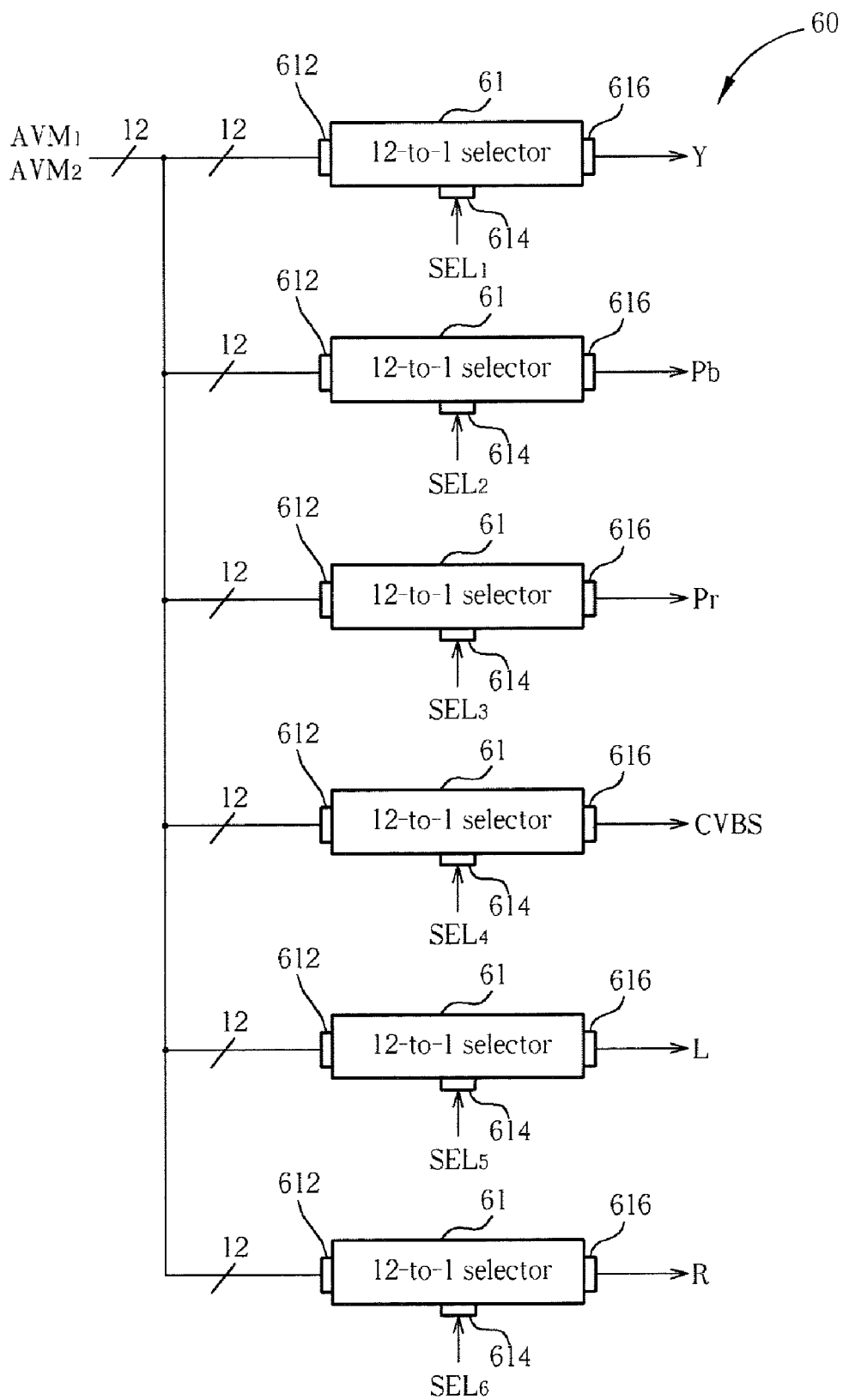
FIG. 6 shows an audio-video switching module according to an embodiment of the present invention.

FIG. 6 shows an audio-video switching module 60 shown in FIG. 1 according to an embodiment of the present invention. The audio-video switching module 60 includes a plurality of twelve-to-one selectors 61, each with an input end 612, a control end 614, and an output end 616. The audio-video switching module 16 receives the first set and the second set of the AV adjusted signals $AVM_1$ and $AVM_2$ generated after impedance adjustment by the impedance adjustment module 15. Thus one set of input ends 612 of each twelve-to-one selector 61 totally includes twelve input ends for receiving the first set of AV adjusted signals $AVM_1$ and the second set of AV adjusted signals $AVM_2$ individually. A control end 614 of each twelve-to-one selector 61 receives control signals $SEL_1$~$SEL_6$ individually, and an output end 616 of each twelve-to-one selector 61 outputs the AV output signals Y, Pb, Pr, CVBS, R, and L individually. Each twelve-to-one selector 61 outputs an AV output signal selected from the AV adjusted signals $AVM_1$ and $AVM_2$ according to its control signal. For example, the control end 614 of the first twelve-to-one selector 61 receives the control signal $SEL_1$ and the output end 616 of the first twelve-to-one selector 61 selectively output the corresponding AV output signal Y according to the control signal $SEL_1$.

Figure 7:
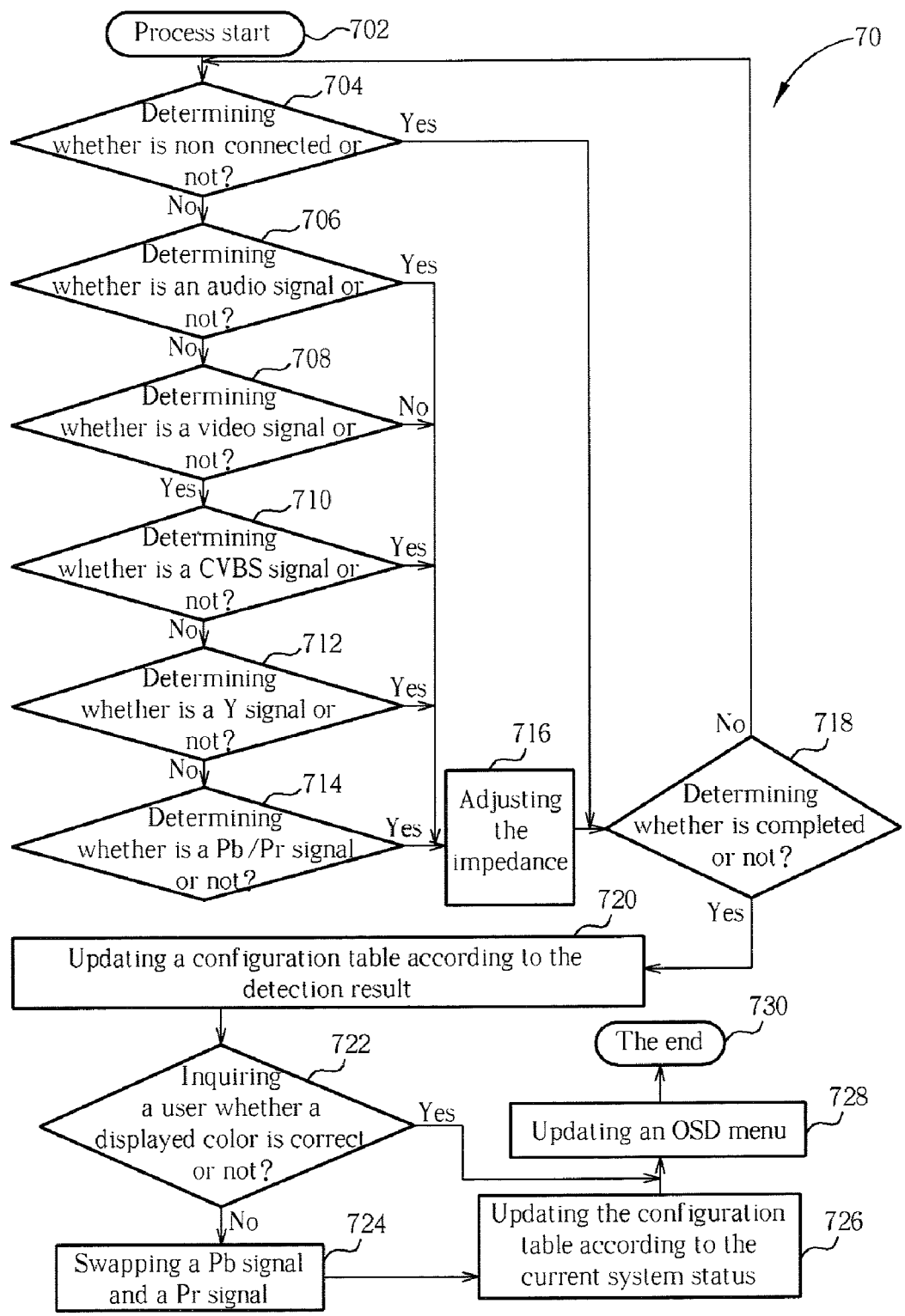
FIG. 7 shows a flowchart of a method capable of auto-configuring AV input signals according to an embodiment of the present invention.

FIG. 7 is a flowchart 70 of a method capable of auto-configuring AV input signals according to an embodiment of the present invention. The flowchart 70 includes the following steps:

Step 702: Process start.

Step 704: Determine whether the input is non-connected. If the input is non-connected, the process proceeds to step 718; otherwise, the process proceeds to step 706.

Step 706: Determine whether the input receives an audio signal. If the input is the audio signal, the process proceeds to step 716; otherwise, the process proceeds to step 708.

Step 708: Determine whether the input receives a video signal. If the input is the video signal, the process proceeds to step 710; otherwise, the process proceeds to step 716.

Step 710: Determine whether the input is a CVBS signal. If the input is the CVBS signal, the process proceeds to step 716; otherwise, the process proceeds to step 712.

Step 712: Determine whether the input is a Y signal. If the input is the Y signal, the process proceeds to step 716; otherwise, the process proceeds to step 714.

Step 714: Determine whether the input is a Pb/Pr signal. If the input is the Pb/Pr signal, the process proceeds to step 716.

Step 716: Adjust the impedance accordingly.

Step 718: Determine whether the detecting process is performed for all inputs. If the detecting process is completed, the process proceeds to step 720; otherwise, the process returns to step 704.

Step 720: Update a configuration table according to the detection result.

Step 722: Inquire a user whether displayed color is correct. If the displayed color is correct, the process proceeds to step 728; otherwise, the process proceeds to step 724.

Step 724: Swap the Pb signal with the Pr signal.

Step 726: Update the configuration table according to the current display status.

Step 728: Update an OSD menu.

Step 730: The end.

In step 704-708, whether non-connected, the audio signal, or the video signal can be determined for each AV input through the impedance characteristics, such as by the audio-video detecting module 14 in FIG. 1 and by the audio-video detector 30 in FIG. 3. In step 710-714, the types of the video signals are further determined as the CVBS signal, the Y signal, or the Pb/Pr signal. In step 716, the matching impedance of each AV input signal is adjusted according to the detection result. For example, the impedance adjustment module 15 in FIG. 1 or the impedance adjustment module 50 in FIG. 5 can adjust the matching impedance of the AV input signals. The configuration table is updated according to the detection result after all the AV inputs are detected completely (in step 720). For instance, the Pb signal and the Pr signal are determined according to a color space statistic within a predetermined duration. Alternatively, a wrong connection for the Pb and Pr signals can be determined by inquiring the user whether the displayed color is correct on screen (step 722-724). At last, the configuration table is updated according to the current system status (step 726). At step 728, the OSD menu is updated accordingly.

Table 1 below lists a table of distinguishing the type of the video signals. The video signal is determined as the CVBS signal if a synchronization signal and a color burst signal are present, the video signal is determined as the Y signal if the synchronization signal is present but the color burst signal is absent, and the video signal is determined as the Pb/Pr signal if the synchronization signal is absent.

TABLE 1

| Synchronization signal (Sync) | Color burst signal | Types of the video signal |
| --- | --- | --- |
| Yes | Yes | CVBS |
| Yes | No | Y |
| No | No | Pb/Pr |

Figure 8:
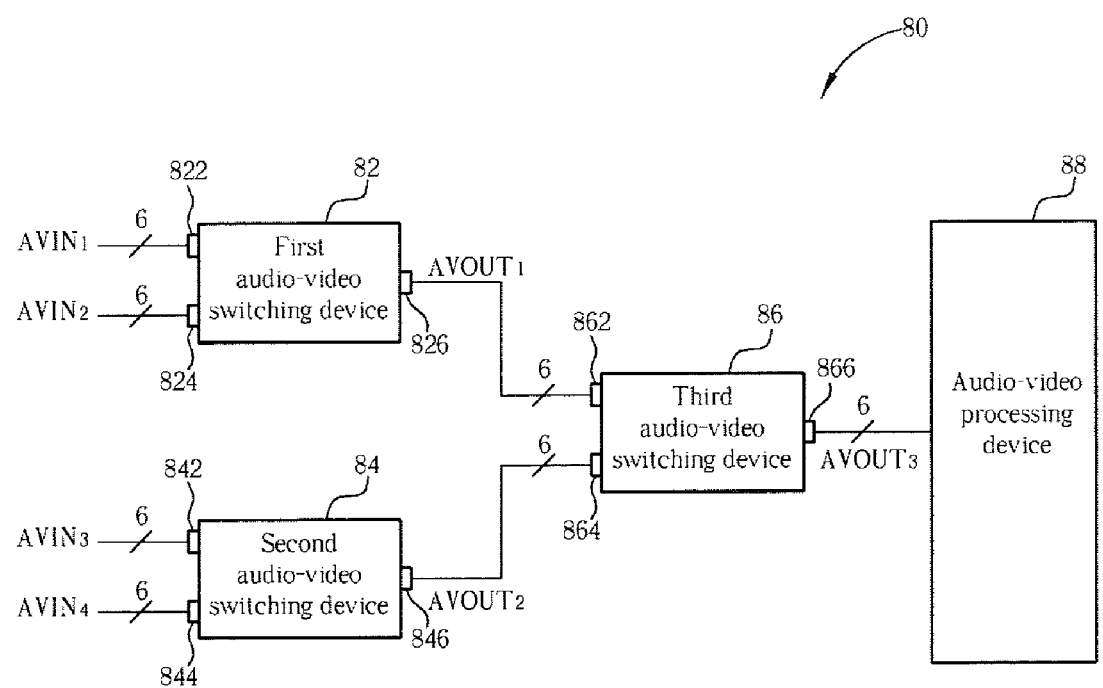
FIG. 8 shows a multimedia device capable of auto-configuring AV input signals according to another embodiment of the present invention.

FIG. 8 shows a multimedia device 80 capable of auto-configuring a plurality of AV input signals according to another embodiment of the present invention. The multimedia device 80 includes a first audio-video switching device 82, a second audio-video switching device 84, and a third audio-video switching device 86, each of which can apply the audio-video switching device 12 shown in FIG. 1. The first audio-video switching device 82 includes a first set of input ends 822 and a second set of input ends 824 for receiving AV input signals $AVIN_1$ and $AVIN_2$ individually. Whereof AV input signals $AVIN_1$ includes the six AV input signals $Y_1$, $Pb_1$, $Pr_1$, $CVBS_1$, $R_1$, and $L_1$, and AV input signals $AVIN_2$ includes the six AV input signals $Y_2$, $Pb_2$, $Pr_2$, $CVBS_2$, $R_2$, and $L_2$. AV output signals $AVOUT_1$ are outputted at an output end 826 with internal AV signal detections and impedance adjustment of the first audio-video switching device 82. Similarly, the second audio-video switching device 84 includes a first set of input ends 842 and a second set of input ends 844 for receiving AV input signals $AVIN_3$ and $AVIN_4$ individually. A second set of AV output signals $AVOUT_2$ is outputted at an output end 846 with internal AV signal detections and impedance adjustment of the second audio-video switching device 84. The third audio-video switching device 86 includes a first set of input ends 862 and a second set of input ends 864 for receiving the AV output signals $AVOUT_1$ and $AVOUT_2$ individually. AV output signals $AVOUT_3$ are outputted at an output end 866 with internal AV signal detections and impedance adjustment of the third audio-video switching device 86 and is then transmitted to an audio-video processing device 88 for further processing.

Figure 9:
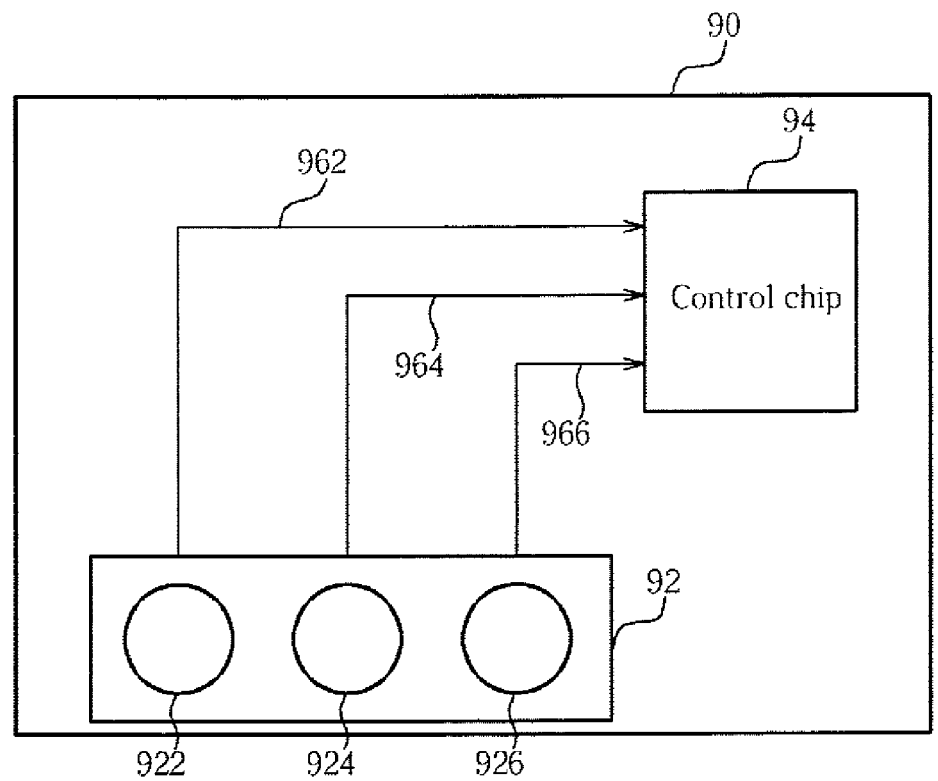
FIG. 9 shows a multimedia device capable of auto-configuring AV input signals according to a preferred embodiment of the present invention.
Figure 9:
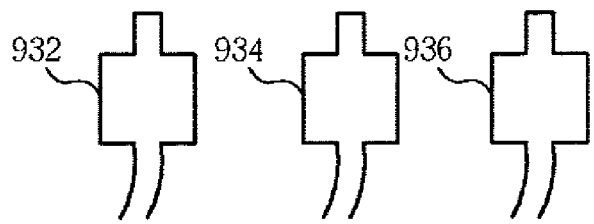

FIG. 9 shows a multimedia device 90 capable of auto-configuring a plurality of AV input signals according to a preferred embodiment of the present invention, such as a flat panel television. The multimedia device 90 includes a control chip 94 and an audio-video connection port 92. The audio-video connection port 92 is coupled to the control chip 94 and includes three audio-video connectors 922, 924, and 926 for connecting to three AV terminals 932, 934, and 936 individually. In this embodiment, only the three audio-video connectors 922, 924, and 926 are exemplified. It should not be limited to three audio-video connectors only and could be six audio-video connectors shown in previous embodiments. The three audio-video connectors 922, 924, and 926 can transmit a fundamental CVBS signal, a left audio signal and a right audio signal. For example, the multimedia device 90 is exemplified as a television. In the prior art, the user must plug the three AV terminals 932, 934, and 936 into the three audio-video connectors 922, 924, and 926 precisely and correspondingly, in order to play video and audio signals. According to the present invention, AV signals 962, 964, and 966 from the three AV terminals 932, 934, and 936 enters the control chip 94 through the three audio-video connectors 922, 924, and 926, and then the AV signals 962, 964, and 966 are detected to auto-configure a connection sequence of the AV signals 962, 964, and 966 with a proper matching impedance, so as that the television is capable of displaying image and playing sound under any connection by the user. For example, each AV signal is determined to be an audio signal or not by the control chip 94 according to the impedance characteristic. Each AV signal is determined to be a composite video broadcast signal or not by the control chip 94 according to a synchronization signal and a color burst signal. Each AV signal is determined to be a Y signal or not by the control chip 94 according to a synchronization signal. Each AV signal is determined to be Pb or Pr signal by the control chip 94 according to the signal correlation or a color space statistic. The multimedia device 90 could be a television or a recording machine, such as a DVD recorder or a hard drive recorder equipped with one or more sets of audio-video connection ports. A recording machine according to the present invention ensures that a desired TV program is recorded, instead of recording a blank video in the prior art due to a wrong connection of the AV terminals.

Figure 10:
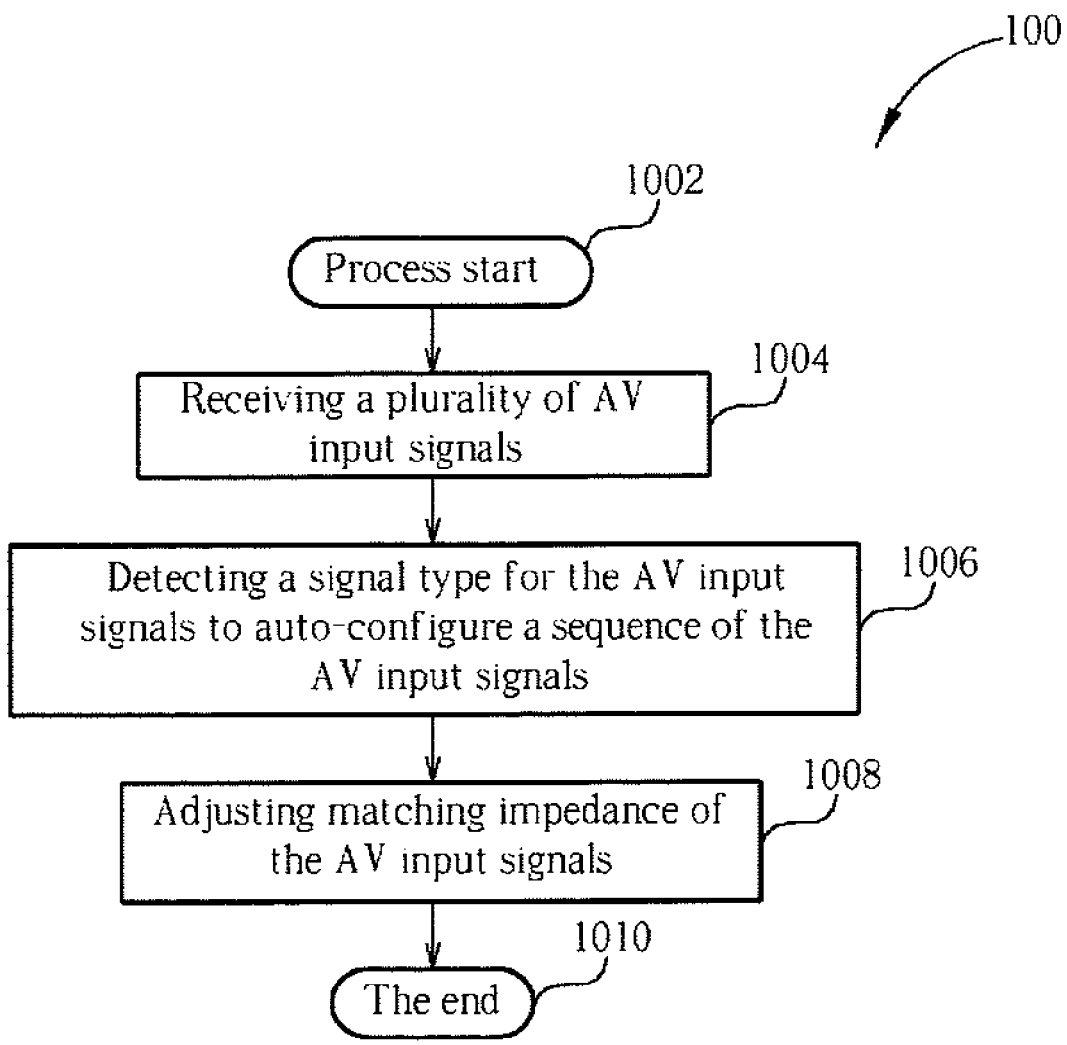
FIG. 10 is a flowchart chart of a method capable of auto-configuring AV input signals according to a preferred embodiment of the present invention.

FIG. 10 is a flowchart 100 of a method capable of auto-configuring a plurality of AV input signals according to an embodiment of the present invention, including the following steps:

Step 1002: Process start.
Step 1004: Receive a plurality of AV input signals.
Step 1006: Detect the AV input signals to auto-configure a connection sequence of the AV input signals.
Step 1008: Adjust matching impedance for the AV input signals.
Step 1010: The end.

In step 1006, for example, each AV input signal is determined to be an audio signal or not according to the impedance characteristic. Each AV signal is determined to be a composite video broadcast signal or not according to a synchronization signal and a color burst signal. The AV signal is determined to be a Y signal or not according to a synchronization signal. Each AV signal is determined to be a Pb or Pr signal according to signal correlation or color space statistic. In step 1008, the matching impedances of the AV input signals is adjusted. For example, a preferred matching impedance for a video signal is 75 Ω.

To sum up, the present invention provides a method capable of auto-configuring AV input signals and associated apparatus. A multimedia device, such as an LCD TV, equips with three kinds of A/V connections, for A/V terminals, an S terminal, and a component video signal terminal, which can be viewed as one audio-video connection port. However, the A/V terminals and the component video signal terminals look the same, and too many audio-video connectors positioning adjacently may result in wrong connections easily. The type and type of each AV input can be auto-detected, and correct paths can be correctly routed for AV output signals Y, Pb, Pr, CVBS, R, and L with proper matching impedance through the audio-video switching device 12 according to the present invention.

Figure 11A:
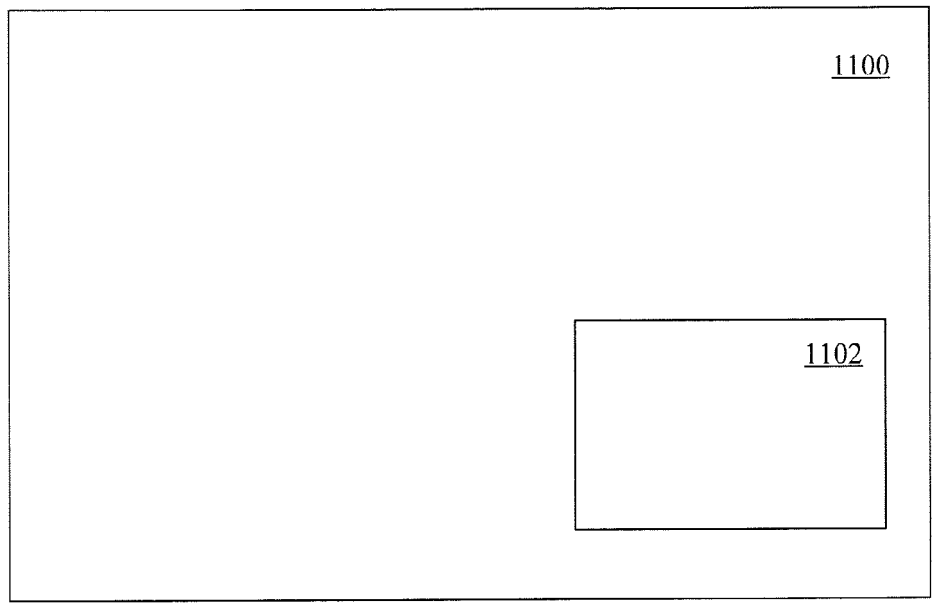
FIG. 11A shows a PIP display.
Figure 11B:
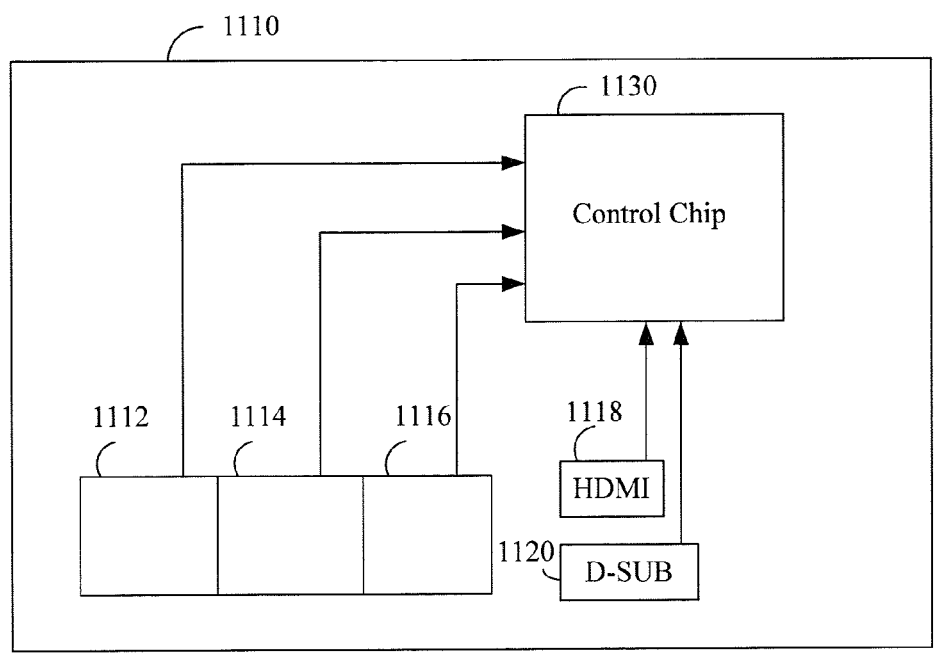
FIG. 11B shows a functional block diagram of a display capable of intelligently selecting signal sources according to one embodiment of the present invention.

FIG. 11A shows a display having picture-in-picture (PIP) function, including a main screen 1100 and a sub-screen 1102. FIG. 11B shows a functional block diagram of a display 1110 capable of intelligently selecting signal sources according to one embodiment of the present invention, including a first AV connection port 1112, a second AV connection port 1114 and a third AV connection port 1116, each of which receives a composite video input and/or component video inputs and audio inputs. Additional AV connection ports, such as an HDMI connection port 1118 and a D-sub connection port 1120 can be included. Each connection port receives a set of audio/video input signals complying with corresponding specification and couples with a control chip 1130 for processing audio/video signals. Above embodiments, such as in FIG. 7, realize a method capable of auto-configuring RCA AV input signals and associated apparatus, so as to correctly display images and play sound. Moreover, HDMI connection port 1118 (or DVI port, not shown) can determine whether audio/video data are present by detecting an activity of a clock signal and/or a SCDT signal or by detecting a so-called off-line mode. An activity of D-sub connection port 1120 can be determined by detecting synchronization signals. Therefore, the present invention can determine if each AV connection port is receiving audio/video data and auto-configure the connections for RCA AV input signals, which are easily confused by a user.

Referring to FIG. 11B, the control chip 130 detects the activity for AV connection ports 1112, 1114, 1116, 1118 and 1120, to indicate whether each AV connection port is "active" or not. Preferably, the display 1110 displays images in PIP in response to a priority and active source(s), which are actually sending video data. For example, a family watches pay TV programs on the display 1110 through a set-top-box, without other TV sources, with the set-top-box, a DVD player and a game machine connecting to the AV connection port 1112, 1114 and 1116 respectively. If the family only starts the DVD player, the display 1110 displays the video from the DVD player on the main screen 1110 (FIG. 11A) since the control chip 1130 only detects one active source from the DVD player through the AV connection port 1114. On the other hand, if the family only starts the game machine, the display 1110 displays the video from the game machine on the main screen 1110, since the control chip 1130 only detects one active source from the game machine through the AV connection port 1116. Therefore, the user can play games easily, without searching a remote controller of the display 1110 and switching sources manually as conventional arts. Moreover, if both of the DVD player and the game machine are started and detected as two active sources, according to the priority, for example, the display 1110 displays two pictures according to these two active video signals in PIP or in POP. The priority can be defined or modified by a system manufacturer or the user. Alternatively, the priority can be defined or updated by a statistic of operating the display 1110. With PIP displaying, the user can swap PIP screens and/or cancel the PIP function to fast display an image of a desired active source on the main screen 1100. Normally, there are often two active sources in a common family. If more than two active sources are detected and two of them, unmatched to what are expected by the user, are displayed on the display 1110, the unexpected picture(s) on the display 1110 reminds the user to turn off the unexpected active video source since possibly the user forgets to turn off some appliances for power saving. Preferably, the subscreen 1102 is enabled in response to the presence of a second active source. As described in the above example, both of the DVD player and the game machine are started and the display 1110 displays pictures according to these two active video signals in PIP normally, but the user finds that the game machine should be turned off. After turning off the game machine, the display 1110 disables the subscreen after the control chip 1130 detects the absence of the video signal from the game machine for a predetermined period, and the display 1110 displays the image on the main screen 1100 according to the active video signal from the DVD player.

Furthermore, when the display 1110 is displaying an image on the main screen 1100 with only one active video signal, a new active video signal enters the display 1110 and is detected. The display 1110 enables the subscreen to display a second image on the subscreen 1102 according to the new active video signal. For example, when the display 1110 is displaying a TV program, the display 1110 polls whether a new signal activity appears at the AV connection ports 1112, 1114, 1116, 1118 and 1120, for example, periodically, e.g. every three seconds. An activity of the component video signals can be determined by detecting presence of a synchronization signal of Y signal. An activity of the HDMI connection port 1118 or a DVI port can be determined by detecting an activity of a clock signal and/or a SCDT signal or by detecting an off-line mode. An activity of D-sub connection port 1120, a CVBS signal or an S signal, can be determined, for example, by detecting whether synchronization signals are present and comply with a standard display resolution.

FIG. 11B shows a display 1110 with a plurality of connection ports 1112, 1114, 1116, 1118 and 1120 etc. For example, conventional source selection can be "TV," "AV," "component video 1," "component video 2," "component video 3," "HDMI" and "VGA" . . . etc. in a fixed selection sequence. When only an AV connection port for the component video 3 couples to an external video source, a user should switch video sources sequentially every time to select "component video 3." Sometimes, the user misses "component video 3" when switching sources, due to pushing the button too quickly or displaying the image a little late, then the user needs to switch sources in another complete selection cycle. According to the present invention, for example, the display 1110 detects three active sources as "TV," "DVD," "and PS3" (a famous game machine), then the user switches sources in an exemplary priority sequence of "DVD," "PS3," and "TV", without interfered by non-active sources. Even though a cyclic selection occurs, it is still fast for the user. The priority can be defined or modified by a system manufacturer or the user. Alternatively, the priority can be defined by a statistic of operating the display 1110. Therefore, the user can switch active sources without limited by conventional fixed selection sequence. With PIP displaying, intelligent active source selection facilitates the user more. The present invention ensures that the user sees an active image with accompanying sound, preferably according to a priority, instead of a blanking image with a noise when activating the display 1110.

Furthermore, if TV source is from a cable TV service provider, it is preferred that the TV source occupies the lowest active source priority since the TV source appears active all day. The intelligent active source selection according to the present invention can benefit a display without PIP/POP function. For example, after the display is activated, an image is displayed according to a priority of active sources. After turning on the display without PIP/POP, the image with the highest priority of active sources is displayed. For example, when a DVD source and the TV source are active at the beginning, the display displays the image from the DVD source since the TV source has the lowest priority. Preferably, after the displaying active source is turned off for a predetermined period, the next active source replaces the absent source, becomes the first priority, and is displayed on the single screen accordingly. In this example, after DVD source is turned off for the predetermined period, the TV source is displayed. A user can switch the sources in an intelligent way, without bothering by inactive sources. Moreover, the mechanism of intelligently selecting sources can be disabled by the user, so the user can also navigate the content of the sources in conventional way.

Figure 12:
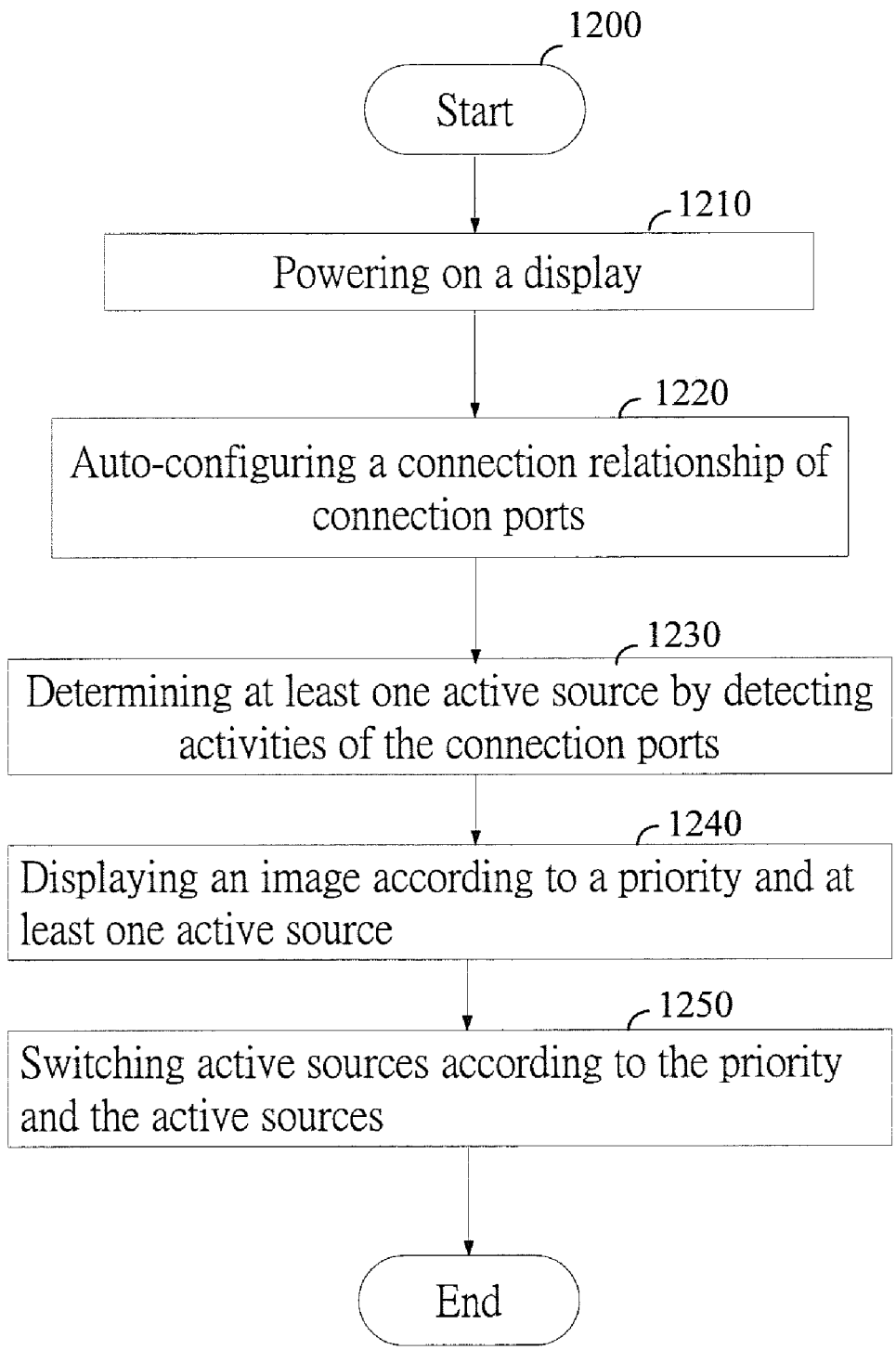
FIG. 12 shows a flowchart of a method of intelligently selecting signal sources according to an embodiment of the present invention.

FIG. 12 shows a flowchart of a method of intelligently selecting signal sources according to an embodiment of the present invention. The method starts at step 1200. At step 1210, a display is powered on and initialized. At step 1220, a connection relationship of a plurality of connection ports, including a CVBS port and a component video input port etc., is auto-configured. At step 1230, determine at least one active source(s) by detecting activities of the connection ports. The connection ports include a CVBS port, a component input port, an S signal port, an HDMI port, a DVI port and a D-sub port etc. At step 1240, according to a priority and the at least one active source(s) the display shows an image. Alternatively, the display shows two images with the highest two priorities in PIP. Therefore, the user can navigate the content of two active sources with the highest two priorities quickly after turning on the display. For example, when totally a DVD source, a game machine and a TV source are active, the display can show PIP according to the DVD source and the game machine source if the TV source has the lowest priority. The priority can be defined or modified by a system manufacturer or the user. Alternatively, the priority can be defined or updated by a statistic of operating the display. At step 1250, the user switches active sources according to the priority and the active sources, without bothering by inactive sources.

Figure 13:
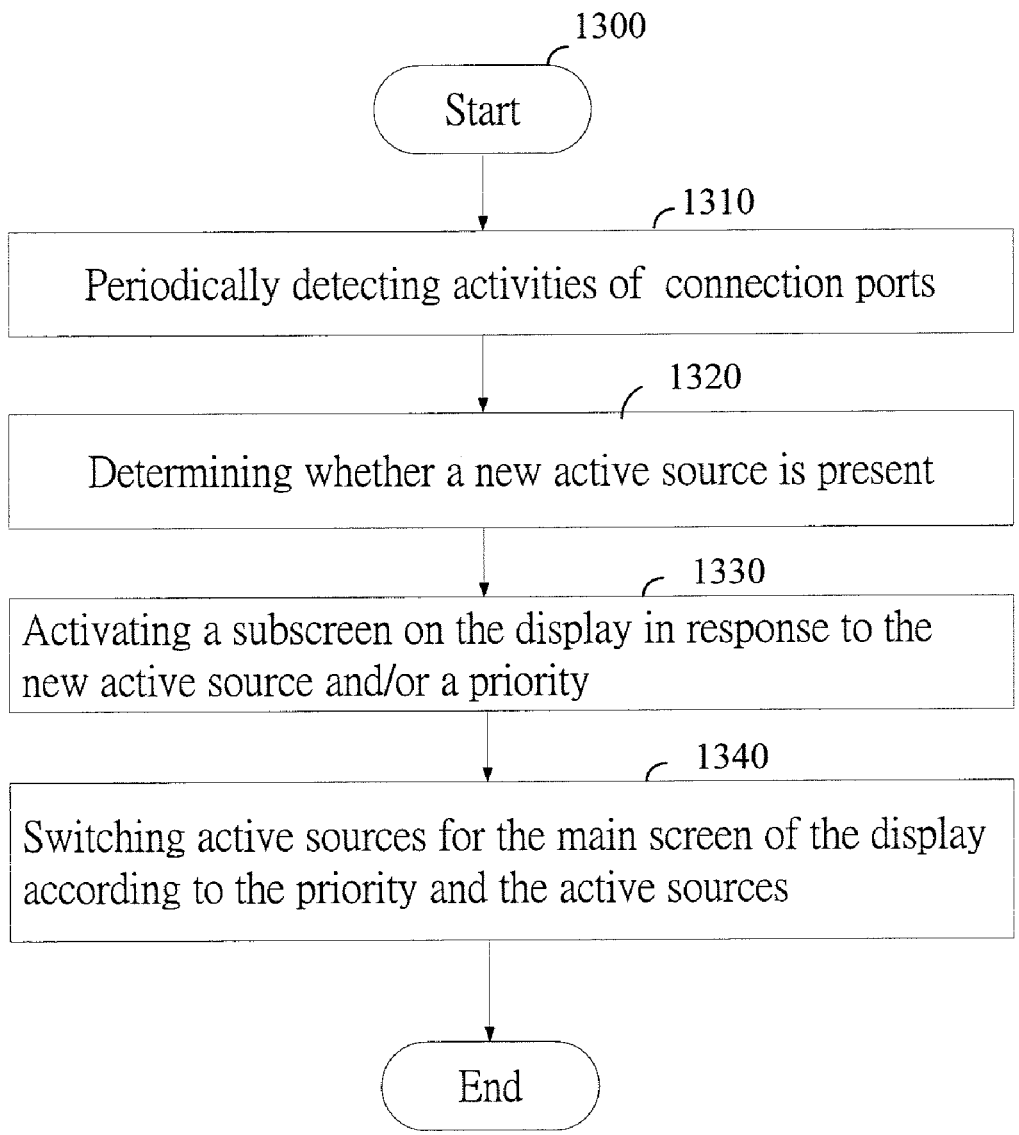
FIG. 13 shows a flowchart of a method of intelligently selecting signal sources according to an embodiment of the present invention.

FIG. 13 shows a flowchart of a method of intelligently selecting signal sources, which can be applied to a display being showing an image normally according to an active source, according to an embodiment of the present invention. The method starts at step 1300. At step 1310, periodically detect activities of a plurality of connection ports. Preferably, periodically detect activities of the connection ports with physical lines connected thereon because some connection ports do not couple with physical lines, depending on individual families. For example, the connection ports, with physical lines connected thereon, are detected every three seconds. Activity of a component port can be determined by detecting whether a synchronization signal of Y signal is present. Activity of an HDMI or a DVI port can be determined by detecting an offline mode or whether activity of clock signal and/or SCDT signal is present. Activities of a D-sub port, a composite port and an S-signal port can be determined by detecting whether a synchronization signal occurs periodically and/or conform to specified display resolutions. At step 1320, determine whether a new active source is present. At step 1330, activate a subscreen on the display to display an image on the subscreen in response to the new active source and/or a priority, in order to facilitate a user to navigate the content of the new active source with the highest priority. For example, assume a PS3 game machine and a DVD player couple to the display at an HDMI port and a component port, respectively, and the HDMI port component port and the component port own the highest and the second priority among active sources. A user is watching TV on a main screen of the display. Meanwhile, the DVD player is powered on to start playing a movie. The display detects activity at the component port and thus activates a subscreen of the display to navigate the content of the movie automatically. Later, the user starts the PS3 game machine. The display also detects activity at the HDMI port and, for example, switches the subscreen of the display to navigate the content of the PS3 game machine automatically since, in this embodiment, HDMI port has the highest priority. The user can turn off some unnecessary active source(s) to navigate the content of a desired active source and save electric power. At step 1340, the user switches active sources for the main screen of the display according to the priority and the active sources, without bothering by inactive sources.

To sum up, the present invention discloses a display capable of intelligently selecting signal sources according to an embodiment of the present invention. The display comprises a plurality of AV connection ports for receiving signals, and a control chip coupled to the connection ports for processing the signals. The control chip detects the activity of AV connection ports to determine at least one active source among the sources. The control chip controls the display to show two images with the highest two priorities in PIP.

The present invention also discloses a method of intelligently selecting signal sources according to an embodiment of the present invention. At first, a display is powered on and initialized. A connection relationship of a plurality of connection ports is auto-configured. Determine at least one active source(s) by detecting activities of the connection ports. According to a priority and the at least one active source(s) the display shows an image. Alternatively, the display shows two images with the highest two priorities in PIP. Thus, the user switches active sources according to the priority and the active sources, without bothering by inactive sources.

The present invention also discloses a method of intelligently selecting signal sources according to an embodiment of the present invention. Periodically detect activities of a plurality of connection ports. Determine whether a new active source is present. Activate a subscreen on the display to display an image on the subscreen in response to the new active source and/or a priority.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display capable of intelligently selecting a source, comprising:
    a plurality of connection ports for receiving a plurality of signals from a plurality of sources; and
    a control chip coupled to the connection ports, wherein the control chip determines at least one active source among the sources by detecting an activity of the connection ports and the control chip controls the display to show an image according to said at least one active source, the control chip comprising:
        an input end for receiving signals corresponding to the active source;
        a current source coupled to the input end for providing a current to the input end;
        an analog-to-digital converter (ADC) coupled to the input end for measuring a voltage value of the input end; and
        an audio-video judgment device coupled to the ADC for determining a type of the active source according to the voltage value.

2. The display of claim 1 wherein the connection ports include an HDMI port, a DVI port, a D-sub port, a component port, a composite port and an S-signal port.

3. The display of claim 1 wherein the control chip detects a clock signal and a SCDT signal to determine whether the activity of an HDMI port of the connection ports is present.

4. The display of claim 1 wherein the control chip detects a synchronization signal to determine whether the activity of a component port is present.

5. The display of claim 1 wherein the control chip detects a synchronization signal to determine whether the activity of a composite port is present.

6. The display of claim 1 wherein the control chip detects a synchronization signal to determine whether the activity of a D-Sub port is present.

7. The display of claim 1 wherein the control chip auto-configures a connection relationship of the connection ports, and then the control chip determines said at least one active source by detecting the activity of the connection ports, and controls the display to show the image according to said at least one active source.

8. The display of claim 1 wherein the control chip controls the display to show the image according to said at least one active source and a priority.

9. The display of claim 1 wherein the control chip controls the display to show images with a first priority and a second priority according to said at least one active source in PIP.

* * * * *